US007439815B2

(12) United States Patent
Schief

(10) Patent No.: US 7,439,815 B2
(45) Date of Patent: Oct. 21, 2008

(54) METHOD AND APPARATUS FOR SWITCHING ON AN ULTRASOUND OSCILLATION SYSTEM

(75) Inventor: Dieter Schief, Muggensturm (DE)

(73) Assignee: Martin Walter Ultraschalltechnik AG, Straubenhardt (DE)

( * ) Notice: Subject to any disclaimer, the term of this patent is extended or adjusted under 35 U.S.C. 154(b) by 331 days.

(21) Appl. No.: 11/478,538

(22) Filed: Jun. 29, 2006

(65) Prior Publication Data

US 2007/0000326 A1 Jan. 4, 2007

(30) Foreign Application Priority Data

Jul. 1, 2005 (DE) ....................... 10 2005 030 764

(51) Int. Cl.
*H02N 2/00* (2006.01)
*H03L 7/00* (2006.01)

(52) U.S. Cl. ........................ 331/4; 331/177 R; 310/317

(58) Field of Classification Search ................. 331/1 R, 331/4, 14, 74, 177 R, 179; 310/300, 311, 310/314, 316.01, 317
See application file for complete search history.

(56) References Cited

U.S. PATENT DOCUMENTS 5,013,982 A * 5/1991 Sasaki ........................ 318/114

FOREIGN PATENT DOCUMENTS

DE 44 00 210 A1 8/1995

* cited by examiner

*Primary Examiner*—David Mis
(74) *Attorney, Agent, or Firm*—Klaus J. Bach

(57) ABSTRACT

In a method and a circuit arrangement for operating an ultrasound oscillation system, wherein an excitation voltage is applied to an ultrasound oscillation system comprising an ultrasound oscillator and components for forming an oscillation circuit for generating an excitation current and wherein the frequency of the excitation voltage is adjustable for operating the ultrasound oscillation system at a predetermined operating point, upon switching on the ultrasound oscillation system, the frequency, beginning with a startup frequency, is changed until the operating point is reached, and, upon switching off the ultrasound oscillation system, the frequency of the excitation circuit is recorded in a storage device and the recorded value is used for determining the startup frequency when the ultrasound oscillation system is again switched on.

6 Claims, 2 Drawing Sheets

METHOD AND APPARATUS FOR SWITCHING ON AN ULTRASOUND OSCILLATION SYSTEM

BACKGROUND OF THE INVENTION

The invention relates to a method for operating an ultrasound oscillation system comprising an ultrasound oscillator and components forming therewith an oscillation circuit, wherein for the generation of an excitation current an excitation voltage is applied to the ultrasound oscillation system, whose frequency is adjustable for the operation of the ultrasound oscillation system at a predetermined operating point, and, upon switching on the ultrasound oscillation system, starting out with a certain startup frequency, the frequency is changed until the operating point is reached.

Furthermore, the invention resides in a circuit arrangement for operating an ultrasound oscillation system according to the method referred to above.

Such a method and such a circuit arrangement are well-known in the state of the art and are used for example in connection with the ultrasound welding apparatus manufactured and sold by the assignee of the present application.

For ultrasound welding apparatus, it is necessary that the energy input into a particular work piece is constant. The ultrasound oscillation system needs to be constant. It is therefore important particularly in connection with ultrasound welding apparatus, that the oscillation amplitude of the ultrasound oscillation system is constant. This is because the energy input into a particular work piece depends on the oscillation amplitude of the welding head which means that the energy input into a particular work piece depends on the oscillation amplitude of the ultrasound oscillation system. Since the oscillation amplitude of the ultrasound oscillation system depends on the excitation current of the ultrasound oscillation system comprising an ultrasound oscillator and the components forming therewith an oscillation circuit, the oscillation amplitude of the ultrasound oscillation system is maintained constant in that the excitation current of the ultrasound oscillation system is kept constant.

In order to be able to control the excitation current, the ultrasound oscillation system is not operated at its series circuit resonance frequency, but generally at a frequency which is between the series circuit resonance frequency and the parallel circuit resonance frequency of the ultrasound oscillation system. Since by changing the frequency with which the ultrasound oscillation system is operated, the impedance of the ultrasound oscillation system is changed, the current flowing through the ultrasound oscillation system can be changed by changing the operating frequency of the ultrasound oscillation system.

If, during the operation of the ultrasound oscillation system, the current through the ultrasound oscillation system is changed, for example by external influences, the frequency of the excitation voltage applied to the ultrasound oscillation system is changed until the excitation current of the ultrasound oscillation system has again reached the previous value.

For reaching the operating point, the frequency of the excitation voltage, beginning at a startup value is changed until the excitation current has reached its predetermined value. The startup frequency is generally about 2 to 5 percent above the operating frequency of the ultrasound oscillation system and, consequently, also above a parallel resonance frequency. The relatively large distance of the startup frequency from the operating point of the ultrasound oscillation system is necessary to ensure that the startup frequency is above the operating frequency of the ultrasound oscillation system also when the operating point has changed for example as a result of a temperature event of the ultrasound oscillation system.

If the frequency of the excitation voltage is reduced, the impedance of the ultrasound oscillation system increases until the parallel resonance frequency is reached whereby the excitation current is reduced. When the parallel resonance frequency is exceeded, the impedance of the ultrasound oscillation system becomes smaller so that the excitation current increases. When the excitation current reaches its predetermined value the ultrasound oscillation system is at its operating point whereupon a control is initiated by which the excitation current is maintained constant.

Because of the relatively large frequency change of the excitation voltage during the switching on of the ultrasound oscillation system, the ultrasound oscillation system reaches its operating state only with a delay. The time delay until the ultrasound oscillating system reaches its operating state may be several hundred milliseconds. This is very disadvantageous since, as a result, an increased amount of time is required for a welding procedure and, consequently, the cycling time of an ultrasound welding apparatus is increased.

It is the object of the present invention to provide a method or, respectively, a circuit arrangement of the type referred to in the introduction in such a way that the time required for reaching the operating point is reduced.

SUMMARY OF THE INVENTION

In a method for operating an ultrasound oscillation system, wherein an excitation voltage is applied to an ultrasound oscillation system comprising an ultrasound oscillator and components for forming an oscillation circuit for generating an excitation current and wherein the frequency of the excitation voltage is adjustable for operating the ultrasound oscillation system at a predetermined operating point, upon switching on the ultrasound oscillation system, the frequency, beginning with a startup frequency, is changed until the operating point is reached, and, upon switching off the ultrasound oscillation system, the frequency of the excitation circuit is recorded and the recorded value is used for determining the startup frequency when the ultrasound oscillation system is again switched on.

Further, in a circuit arrangement for operating an ultrasound oscillation system including an amplifier with an input and an output, which provides the excitation voltage as well as the excitation current for the ultrasound oscillation system, and an oscillator whose frequency is adjustable at a control input and whose output is connected to the input of the amplifier, and also a ramp generator, which has an output connected to the control input of the oscillator and provides a ramp-like output voltage, a storage device is provided for storing the last operating frequency of the ultrasound oscillation system before a shut-down thereof.

Since the circuit arrangement according to the invention includes a storage device for storing the respective last operating frequency of the ultrasound oscillation system before it is switched off, it is advantageously possible to consider the respective value of the frequency at which the ultrasound oscillating system was operated immediately before it was switched off, that is, at the end of the operating cycle, when the ultrasound oscillation system is switched on the next time. This means that the startup frequency can be selected with the following operating cycle of the ultrasound oscillation system so that it is in immediate proximity of the operating point. In this way, the time for reaching the operating point of the ultrasound oscillation system is substantially reduced. It is therefore no longer necessary to select, for operational safety reasons, the start-up frequency substantially above the operating frequency of the ultrasound oscillation system.

A startup frequency which is substantially above the operating frequency of the ultrasound oscillation system needs to be selected only when the ultrasound oscillation system had not been operated over an extended period. That means if the ultrasound oscillation system has not been operated for such a long period that the operating point could have substantially changed for example as a result of temperature changes, the startup frequency is not determined from the last recorded operating frequency of the ultrasound oscillating system but a startup frequency is selected which corresponds to a predetermined initiation value. An initiation operation is consequently performed not only in connection with the very first startup operation of the ultrasound oscillation system but in connection with each startup operation after an extended shut down.

However during cycle operation of the ultrasound oscillation system, the startup frequency is formed form the respective last recorded operating frequency of the ultrasound oscillation system. Advantageously the startup frequency is formed from the recorded value of the operating frequency and an offset frequency value as it is provided for a particular embodiment of the invention. In this way, it can be made sure in an advantageous manner that slight changes of the operating point during the shut down period of an operating cycle can be taken into consideration. Preferably, the offset frequency value is about 0.2% to 5%, particularly 0.5% to 2.6% and particularly 1.0 percent of the operating frequency. It has been found that a fault-free operation can be safely provided with such an offset frequency without the startup frequency being too far off the operating point.

The present invention will become more readily apparent from the following description of an exemplary embodiment thereof with reference to the accompanying drawings.

DESCRIPTION OF A PARTICULAR EMBODIMENT

Figure 1:
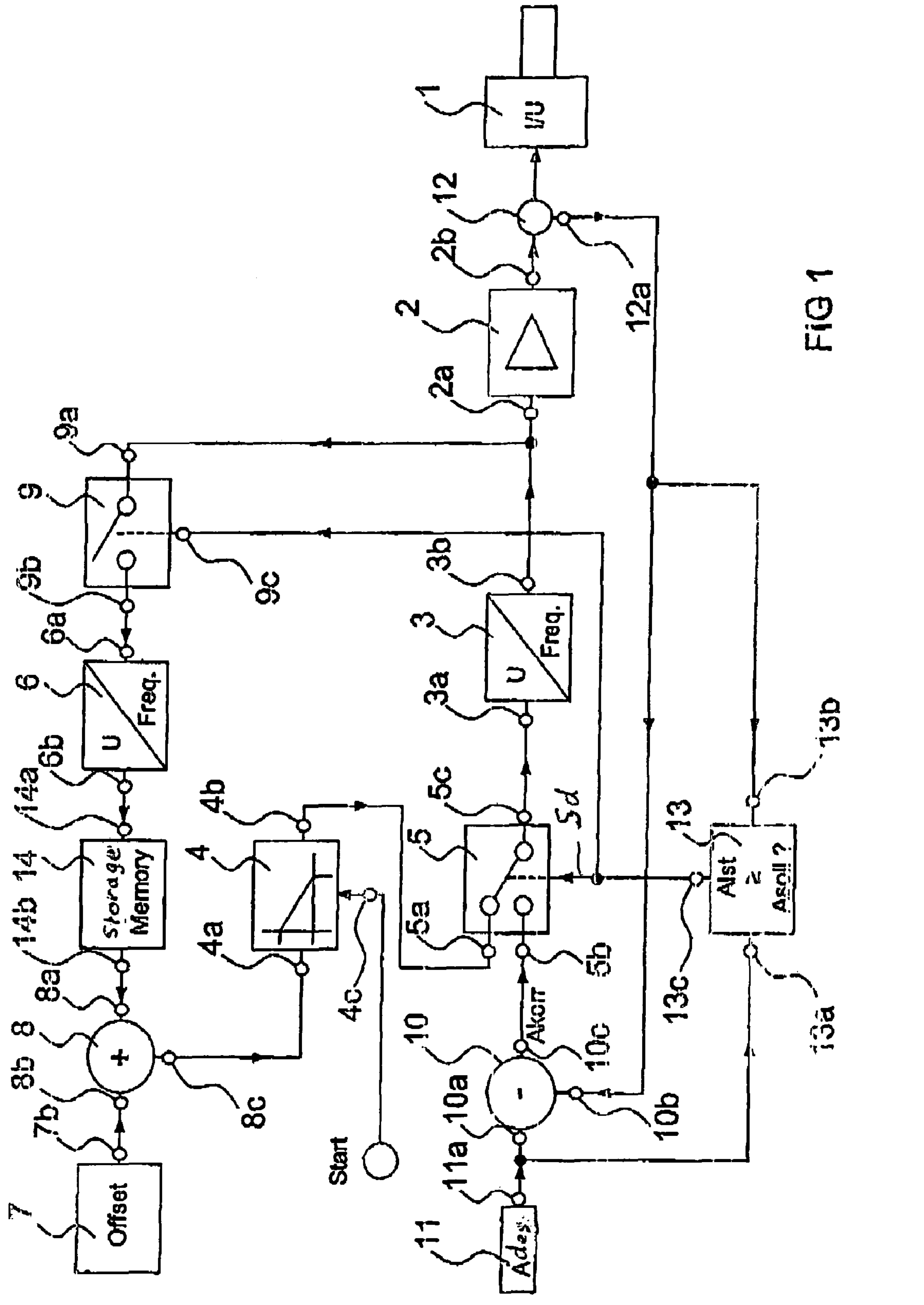
FIG. 1 is a schematic representation of a circuit arrangement according to the invention.

As apparent from FIG. 1, an ultrasound oscillation system 1 of an ultrasound welding apparatus comprising an ultrasound oscillator and components co-operating therewith to form an oscillation circuit is connected to the output 2*b* of an amplifier 2. The input 2*a* of the amplifier 2 is connected to the output 3*b* of an oscillator 3. The frequency of the oscillator can be adjusted at a control input 3*a*. The adjustable frequency range extends from about 15 kHz to 70 kHz.

The control input 3*a* of the oscillator 3 is connected to the output 5*c* of a switch 5. The switch 5 is operated by a control input 5*d* wherein the switch 5, in a first position, connects the output 5*c* to an input 5*a* of the switch. In a second position of the switch 5, the output 5*c* of the switch is connected to a second input 5*b* of the switch 5.

The first input 5*a* of the switch 5 is connected to the output 4*b* of a ramp generator 4. The ramp generator 4 provides at its output 4*b* a ramp-like output voltage, whose startup value is adjustable at a level input 4*a* of the ramp generator 4. For starting the ramp generator 4, a startup input 4*c* is provided.

The level input 4*a* of the ramp generator 4 is connected to an output 8*c* of a summing device 8. A first input 8*a* of the summing device 8 is connected to the output 14*b* of the storage memory 14. A second input 8*b* of the summing device 8 is connected to the output 7*b* of an offset signal transmitter 7. At the output 8*c* of the summing device 8, the sum formed from the output signal of the storage 5 and the offset signal transmitter 7 is provided.

The input 14*a* of the storage memory 14 is connected to the output 6*b* of a frequency/voltage converter 6. The input 6*a* of the frequency/voltage converter 6 is connected to the output 9*b* of a switch 9. The input 9*a* of the switch 9 is connected to the input 2*a* of the amplifier 2. The switch 9 is operable by means of a control input 9*c*. In the actuated state, the input 9*a* of the switch 9 is connected to the output 9*b* of the switch 9. This means that, in the actuated state of the switch 9, a voltage with the frequency with which the ultrasound oscillation system is operated is present at the input 6*a* of the frequency/voltage converter 6. The signal present at the output 6*b* of the frequency/voltage converter 6 is proportional to the frequency of the voltage present at the input 6*a* of the frequency/voltage converter.

The second input 5*b* of the switch 5 is connected to the output 10*c* of a subtraction device 10. A first input 10*a* of the subtraction device 10 is connected to the output 11*a* of a desired value transmitter 11. A second input 10*b* of the subtraction device 10 is connected to the output 12*a* of a current sensor 12. The current sensor 12 senses the output current I of the amplifier 2 and consequently, the excitation current I of the ultrasound oscillation system 1.

The signal present at the output 10*c* of the subtraction device 10 corresponds to the difference between the output signal of the desired value transmitter 11 present at the input 10*a* of the subtraction device 10 and the output signal of the current sensor 12 present at the second input 10*b* of subtraction device 10.

The output 11*a* of the desired value transmitter 11 is connected to the first input 13*a* of a comparator 13. A second input 13*b* of the comparator 13 is connected to the output 12*a* of the current sensor 12. The comparator 13 provides at its output 13*c* a signal for operating the switch 5 and the switch 9.

If the signal present at the second input 13*b* of the comparator 13 is smaller than the signal present at the first input 13*a* of the comparator 13, the signal provided at the output 13*c* of the comparator is zero, so that the switch 9 is not actuated, that is, it is open and the switch 5 is in its first position in which the output 5*c* of the switch 5. If the signal present at the second input 13*b* of the comparator 13 is as large or larger than the signal present at the first input 13*a* of the comparator 13, a signal is provided at the output 13*a* of the comparator 13, by which the switch 9 is actuated that is the input 9*a* of the switch 9 is connected to the output 9*b* of the switch 9 and the switch 5 is in its second position wherein the output 5*c* of the switch 5 is connected to the second input 5*b* of the switch 5.

With the very first energization of the circuit arrangement or, respectively, the switching on of the circuit arrangement after an extended pause, an initiation value is present at the output 14*b* of the storage memory 14, which is stored in a first storage area of the storage memory 14. The initiation value is so selected that the initial value of the ramp-like output voltage of the ramp generator 4 sets the oscillator 3 to such a value that it generates a voltage with a frequency which is about 5% above the design series resonance frequency $f_{sr}$ of the ultrasound oscillation system 1 and, consequently, also above the parallel resonance frequency $f_{pr}$ of the ultrasound oscillation system 1. This frequency is designated in FIG. 2 by the reference $f_{start}$.

Figure 2:
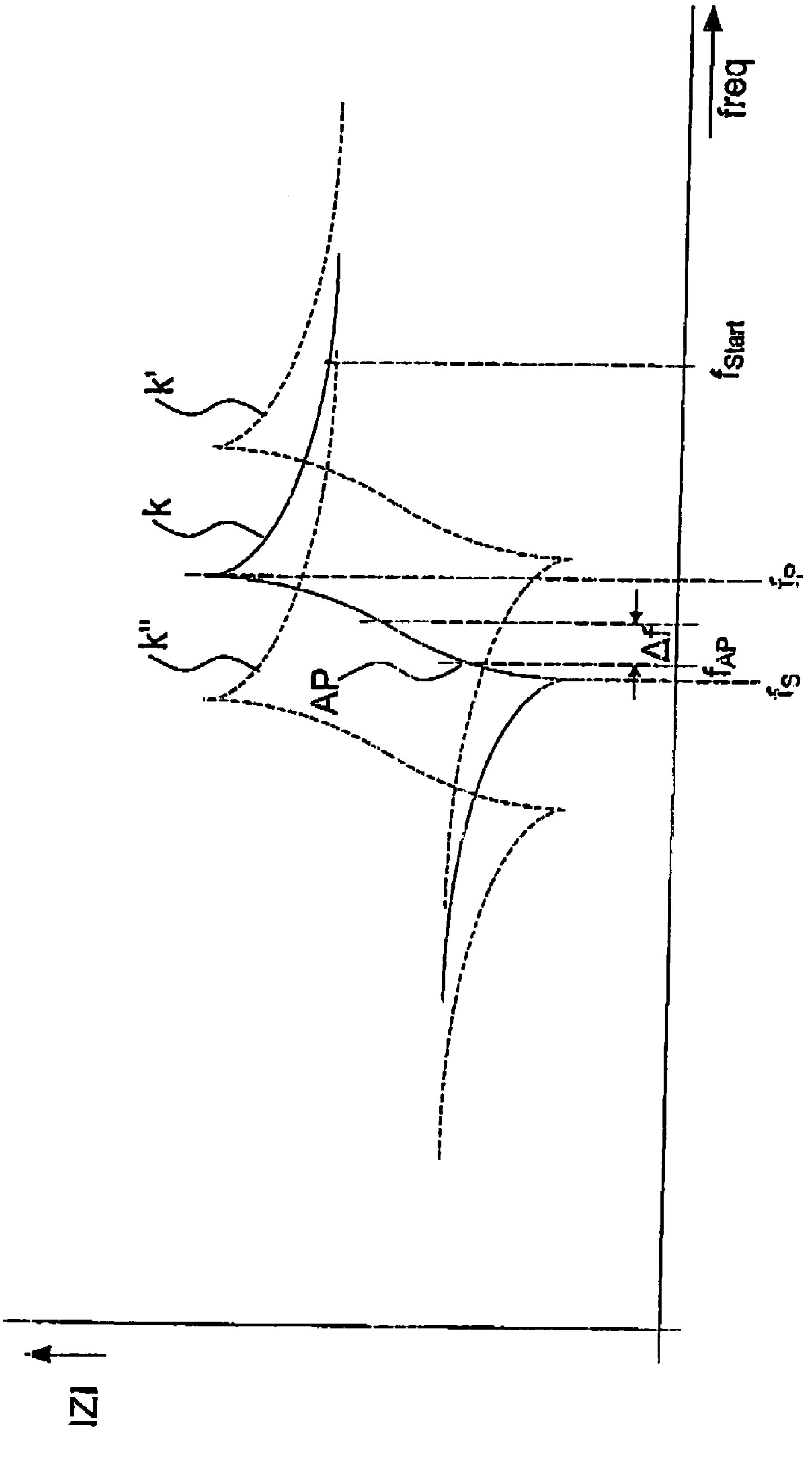
FIG. 2 shows the impedance values of an ultrasound oscillation over the frequency.

As apparent from FIG. 2, the resistance 2 of the ultrasound oscillation system 1 which is represented in FIG. 2 by the curve K is higher at this frequency $f_{start}$ than it is at the operating frequency $f_{AP}$.

The excitation current sensed by the sensor 12 is therefore smaller than the desired value of the excitation current which is present during operation of the ultrasound oscillation system 1 at the operating point AP. Correspondingly, the signal present at the second input 13*b* of the comparator 13 is smaller than the signal present at the first input 13*a* of the comparator 13 so that the signal present at the output 13*c* of the comparator 13 is zero. The switch 5 therefore is in its first position, that is, the first input 5*a* of the switch 5 is connected to the output 5*c* of the switch 5 so that the signal present at the output 4*b* of the ramp generator 4 is also pre-sent at the input 3*a* of the oscillator 3.

Since the output signal of the ramp generator 4 becomes continuously smaller, also the frequency of the oscillator 3 becomes smaller. As a result, first the impedance of the ultrasound oscillator system 1 increases, whereby the excitation current is further reduced so that first nothing changes in the condition of circuit arrangement. However, when the frequency drops below the parallel resonance frequency $f_{pr}$, the impedance Z of the ultrasound oscillation system 1 drops rapidly whereby the excitation current increases. When the excitation current reaches the desired value, that is, when the signal present at the second input 13*b* of the comparator 13 equals the signal present at the first input 13*a* of the comparator 13, that is, the output signal of the desired value transmitter 11, a signal is provided at the output 13*c* of the comparator 13, which causes switching of the switch 5 and of the switch 9.

Upon actuation of the switch 5, the second input 5*b* of the switch 5 is connected to the output 5*c* of the switch 5. As a result, a closed control circuit is established whereby the excitation current sensed by the current sensor 12 is controlled to the predetermined value as provided by the desired value transmitter 11. This particular control is a commonly known current control and is therefore not described. By the actuation of the switch 9, the input 9*a* of the switch 9 is connected to the output 9*b* of the switch 9. As a result the output voltage of the oscillator 3 is present at the input 6*a* of the frequency/voltage converter 6. A value corresponding to the frequency of this voltage is continuously written into a second storage area of the storage device 5. In this way, upon opening of the switch 9, there is always a value in the second storage area of the storage device 5 which corresponds to the frequency which the output voltage of the oscillator had when the switch 9 opened. That is, when the ultrasound oscillating system is switched off, whereby the switch 9 is opened, a signal is stored in the second storage area of the storage device which corresponds to the frequency with which the ultrasound oscillation system 1 was operated at the time it was switched off.

During cyclic operation of the ultrasound oscillation system 1, or respectively, when there is no large time delay, with the next switching on of the ultrasound oscillation system 1, at the output 14*b* of the storage device 14 the value is provided which is stored in the second storage area of the storage device 14. To this value, the output value of the offset transmitter 7 is added in the summing device 8. As a result, at the input 4*a* of the ramp generator 4, a value is provided which causes the startup value of the ramp-like output voltage of the ramp generator to set the oscillator in such a way that it provides a voltage with a frequency $f_{start-new}$ which is larger by an offset value$_{deltaf}$ than the frequency at which the ultrasound oscillation system 1 was operated at the time of the earlier shutdown.

Since at this frequency $f_{start-new}$, the impedance of the ultrasound oscillation system 1 is larger than it is at the operating point AP, the excitation current is smaller than the desired value thereof. As a result, no signal is present at the output 13*c* of the comparator 13 so that the switch 5 is in its first position, which means that the output 4*b* of the ramp generator 4 is connected to the input 3*a* of the oscillator 3. Corresponding to the output signal of the ramp generator 4, the frequency of the oscillator 3 becomes smaller whereby the impedance of the ultrasound oscillation system is reduced so that the excitation current increases. When the excitation current reaches its desired value, the comparator 13 provides at its output 13*a* a signal which causes the switch 5 as well as the switch 9 to be actuated. The further procedures correspond to those described above.

Since the new startup frequency $f_{start\ new}$ is only slightly above the operating point frequency $f_{ap}$, the operating point is reached much earlier then with a start up at the original frequency $f_{start}$.

Since the ultrasound oscillation system 1 is switched on with a frequency based on the frequency at which the ultrasound oscillation systems was operated just before it was shut down advantageously for example also a temperature change of the ultrasound oscillation system 1 is taken into consideration without the need for particular measures. As shown in FIG. 2, the characteristic line K of the ultrasound oscillation system 1 can be displaced for example because of temperature influences. It may be displaced such that the series resonance frequency moves upwardly as it is represented by the curve K". In any case, as starter frequency $f_{start\ new}$ a value is used which is slightly above the last operating point frequency $f_{ap}$. This means that the ultrasound oscillation system 1 is switched on always in close vicinity of an operating point independently whether the operating point has moved during the previous operation.

What is claimed is:

1. A method for operating an ultrasound oscillation system (1) including an ultrasound oscillator and components forming therewith an oscillation circuit, said method comprising the steps of: for generating an excitation current, applying an excitation voltage to the ultrasound oscillation circuit (1) whose frequency is adjustable for operating the ultrasound oscillation system (1) at a predetermined operating point (AP), wherein, with the switching on of the ultrasound oscillation system (1), the frequency is changed starting out with a starting frequency ($f_{start}$) until the operating point (AP) is reached, And, upon switching the ultrasound oscillation system (1) off, recording the frequency of the excitation voltage and using the recorded value for determining the starting frequency ($f_{start\ new}$) when the ultrasound oscillation system is switched on the next time.

2. A method according to claim 1, wherein the starting frequency ($f_{start\ new}$) is formed by the recorded value and an offset frequency value.

3. A method according to claim 1, wherein, during an initiation operation of the ultrasound oscillation system (1), the starting frequency ($f_{start}$) corresponds to a predetermined initiation value.

4. A circuit arrangement for operating an ultrasound oscillation system (1) including an amplifier (2) with an input (2*a*) and an output (2*b*) which provides the excitation voltage and the excitation current for the ultrasound oscillation system (1), an oscillator (3) whose frequency is adjustable at a control input (3*a*) and having an output (3*b*) connected to the input (2*a*) of the amplifier (2), and a ramp generator (4) which, having an output (4*b*) providing a ramp-shaped output voltage and being connected to the control input (3*a*) of the oscillator (3), and a storage device (14) for storing the respective last operating frequency of the ultrasound oscillation system (1) upon switching off of the ultrasound oscillation system.

5. A circuit arrangement according to claim 4, wherein the output signal of the storage device (14) forms the startup value of the ramp generator (4).

6. A circuit arrangement according to claim 5, wherein an offset transmitter (7) is provided whose output signal is added to the output signal of the storage device (14).

* * * * *